(12) United States Patent
Liu et al.

(10) Patent No.: US 12,267,967 B2
(45) Date of Patent: Apr. 1, 2025

(54) SPLICING DISPLAY DEVICE

(71) Applicant: TCL CHINA STAR OPTOELECTRONICS TECHNOLOGY CO., LTD., Guangdong (CN)

(72) Inventors: Bin Liu, Guangdong (CN); Liang Hu, Guangdong (CN); Liangying Xu, Guangdong (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 241 days.

(21) Appl. No.: 17/814,520

(22) Filed: Jul. 24, 2022

(65) Prior Publication Data
US 2023/0413457 A1 Dec. 21, 2023

(30) Foreign Application Priority Data
Jun. 16, 2022 (CN) .......................... 202210687066.7

(51) Int. Cl.
*H05K 5/00* (2006.01)
*H01L 27/15* (2006.01)
*H05K 5/02* (2006.01)

(52) U.S. Cl.
CPC ......... *H05K 5/0021* (2013.01); *H01L 27/156* (2013.01); *H05K 5/0018* (2022.08); *H05K 5/0217* (2013.01)

(58) Field of Classification Search
CPC .......... G09F 9/3026; G09F 9/33; G09F 9/301; G09F 13/18
See application file for complete search history.

(56) References Cited

U.S. PATENT DOCUMENTS 8,709,864 B2 * 4/2014 Yamazaki ......... H01L 21/02631
257/43
2008/0130203 A1 * 6/2008 Doberstein ........... F25D 29/005
361/825
(Continued)

FOREIGN PATENT DOCUMENTS

CN 113516923 A 10/2021
CN 113903271 A 1/2022
(Continued)

OTHER PUBLICATIONS

Chinese Office Action issued in corresponding Chinese Patent Application No. 202210687066.7 dated Mar. 31, 2023, pp. 1-7.

*Primary Examiner* — Van N Chow
(74) *Attorney, Agent, or Firm* — PV IP PC; Wei Te Chung

(57) ABSTRACT

A splicing display device includes a back plate, and a plurality of splicing display units disposed on the back plate; wherein the back plate has a plurality of splicing areas arranged in one-to-one correspondence with the plurality of splicing display units; each of the splicing areas is defined with at least one limit slot opening toward the splicing display unit; each of the splicing display units includes a display panel corresponding to the splicing area and at least one connection mechanism fixed on a side of the display panel close to the back plate; the at least one limit slot is arranged in one-to-one correspondence with the at least one connection mechanism; each of the connection mechanisms is located in the corresponding limit slot, and is detachably connected to a bottom of the corresponding limit slot.

19 Claims, 2 Drawing Sheets

(56) References Cited

U.S. PATENT DOCUMENTS

2022/0104369 A1\* 3/2022 Yao .................... H04M 1/0268
2024/0094442 A1\* 3/2024 Fu ....................... G02F 1/13336
2024/0116246 A1\* 4/2024 Zhang .................. B29C 64/277

FOREIGN PATENT DOCUMENTS

CN          215954702 U      3/2022
CN          114495732 A      5/2022

\* cited by examiner

SPLICING DISPLAY DEVICE

CROSS-REFERENCE TO RELATED APPLICATION

The present application claims priority to Chinese patent application No. 202210687066.7, filed on Jun. 16, 2022, and titled "SPLICING DISPLAY DEVICE", which is incorporated by reference in the present application in its entirety.

FIELD OF INVENTION

The present disclosure relates to a technical field of display, and especially to a splicing display device.

BACKGROUND OF INVENTION

Compared with liquid crystal displays (LCDs), organic light-emitting diodes (OLEDs) and other display technologies, mini/micro LEDs have inter-generational advantages such as brightness, resolution, energy consumption, service life, response speed, and thermal stability, and are internationally recognized display technologies for the future.

At present, a big screen display market is very large, such as shopping mall advertisements, center consoles, conference rooms, gymnasiums, etc. Mini/micro LEDs have obvious technical advantages in large-sized display field because they can be spliced freely by a single panel. As shown in FIG. 1 and FIG. 2, a traditional single panel splicing method is to first adhere an Open Cell (OC) display panel 1' to a metal single panel 3' through foam glue 2' to form a single panel module 4'. Wherein magnets 5' are embedded in specific positions of the metal single panel 3' (for example, first magnets 51' and second magnets 52' set in a stack) and are fixed by screws 6'. The single panel module 4' is then assembled to a large metal back plate 7' by magnetic attraction. However, the traditional single panel splicing method causes the single panel module to be heavier and thicker. Structures of the single panel module are complicated and difficult to detach, and the single panel module is not conducive to maintenance and analysis.

SUMMARY OF INVENTION

The present application provides a splicing display device, which can significantly simplify on a basis of ensuring supportability of a display panel, thereby significantly reducing weight and thickness of a splicing display unit and making the splicing display unit thinner, lighter, and easier to detach for maintenance.

The present application provides a splicing display device, comprises a back plate and a plurality of splicing display units disposed on the back plate;
the back plate has a plurality of splicing areas arranged in one-to-one correspondence with the plurality of splicing display units; each of the splicing areas is defined with at least one limit slot opening toward the splicing display units; each of the splicing display units comprises a display panel corresponding to the splicing area and at least one connection mechanism fixed on a side of the display panel close to the back plate; and
the at least one limit slot is arranged in one-to-one correspondence with the at least one connection mechanism; each of the connection mechanisms is located in the corresponding limit slot and is detachably connected to a bottom of the corresponding limit slot.

Optionally, the side of the display panel close to the back plate is laminated on a side of the back plate close to the display panel; and/or, a side of the connection mechanism close to the back plate is laminated on a side of the limit slot close to the display panel.

Optionally, an area of an orthographic projection of the connection mechanism on the back plate is smaller than an area of an orthographic projection of the limit slot on the back plate.

Optionally, a distance between at least one side surface of the connection mechanism and a side wall of the corresponding limit slot is greater than 0.

Optionally, a distance between any one of side surfaces of the connection mechanism and any one of side walls of the corresponding limit slot is greater than 0.

Optionally, a position of the connection mechanism in the limit slot can be adjusted so that the display panel and the back plate can be accurately aligned.

Optionally, the at least one connection mechanism comprises an adhesive unit and an attraction unit; the adhesive unit is located between the display panel and the attraction unit; and the attraction unit is detachably and attractively connected to the bottom of the corresponding limit slot.

Optionally, material of the adhesive unit comprises foam glue.

Optionally, a material of the back plate comprises metal; and a material of the attraction unit comprises a magnet.

Optionally, an orthographic projection of the attraction unit on the display panel is completely located within an orthographic projection of the adhesive unit on the display panel.

Optionally, each of the splicing display units further comprises a plurality of connection mechanisms evenly distributed.

Optionally, a shape of the display panel is rectangle; the splicing display unit comprises four of the connection mechanisms respectively disposed close to four corners of the display panel.

Optionally, the splicing display unit further comprises one of the connection mechanisms located in a center of the display panel, a distance between the one of the connection mechanism in the center of the display panel to each one of the four of the connection mechanisms close to the four corners of the display panel is same.

Optionally, the connection mechanisms are two long strips distributed on both sides of the display panel and the limit slots of the back plate are also two long strips corresponding to the connection mechanisms.

Optionally, the connection mechanisms are four long strips distributed on four sides of the display panel and the limit slots of the back plate are also four long strips corresponding to the connection mechanisms.

Optionally, when all of the plurality of the connection mechanisms are sufficient to firmly attract the display panel and the back plate together, the area of the orthographic projection of each connection mechanism on the back plate is larger, number of the connection mechanisms is fewer, and the area of the orthographic projection of each connection mechanism on the back plate is smaller, number of the connection mechanisms is more.

Optionally, a shape of an orthographic projection of the connection mechanism on the back plate is same as a shape of an opening of the limit slot.

Optionally, the shape of the orthographic projection of the connection mechanism on the back plate and the shape of the opening of the limit slot are both circle.

Optionally, the shape of the orthographic projection of the connection mechanism on the back plate and the shape of the opening of the limit slot are both rectangle.

Optionally, the display panel comprises any one of a mini-LED device and a micro-LED device.

In the splicing display device provided by the present application, the connection mechanism located on a back of the display panel can be directly assembled into the limit slot on the back plate, and can be detachably connected to the bottom of the limit slot (for example, magnetic attraction connection), so as to realize detachable connection between the display panel and the back plate. Compared with a traditional single panel splicing method, the embodiment of the present application significantly simplifies structures of the splicing display unit on a basis of ensuring supportability of the display panel, thereby significantly reducing weight and the thickness of the splicing display unit, and making the splicing display unit thinner and lighter and easier to detach for maintenance.

BRIEF DESCRIPTION OF DRAWINGS

The technical solutions and other beneficial effects of the present application will be apparent through the detailed description of the specific embodiments of the present application in conjunction with the accompanying drawings.

DETAILED DESCRIPTION OF PREFERRED EMBODIMENTS

Figure 1:
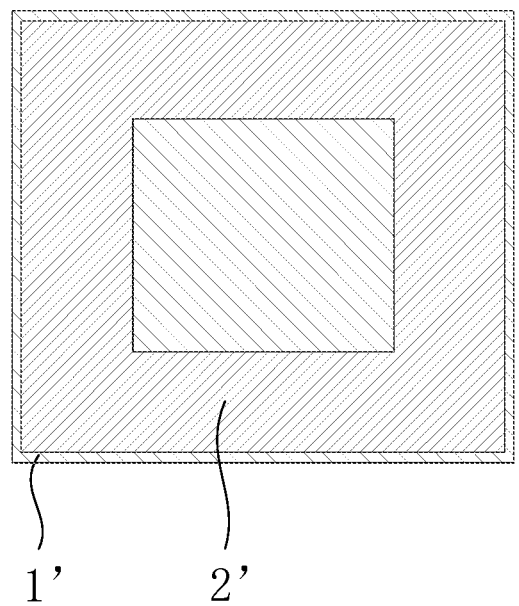
FIG. 1 is a plan view schematic structural diagram of a back of an exemplary display panel.

The technical solutions in the embodiments of the present disclosure will be clearly and completely described below with reference to the drawings in the embodiments of the present disclosure. Obviously, the described embodiments are only a part of the embodiments of the present disclosure, but not all of the embodiments. Based on the embodiments in the present disclosure, all other embodiments obtained by those skilled in the art without creative work fall within the protection scope of the present disclosure.

In the description of the present application, it should be understood that the terms "center", "longitudinal", "lateral", "length", "width", "thickness", "upper", "lower", "front", "rear", "left", "right", "vertical", "horizontal", "top", "bottom", "inside", "outside", "clockwise", "counterclockwise" etc., or the positional relationship is based on the orientation or positional relationship shown in the accompanying drawings. It is only for the convenience of describing the present application and simplifying the description, rather than indicating or implying that the referred device or element must have a particular orientation, be constructed and operate in a particular orientation, and therefore should not be construed as a limitation of the present application. In the description of the present application, "a plurality of" means two or more, unless otherwise expressly and specifically defined.

In the description of the present application, it should be noted that, unless otherwise expressly specified and limited, the terms "install", "connect" and "connect" should be understood in a broad sense, for example, it may be a fixed connection or a detachable connection connected, or integrally connected. It can be a mechanical connection, an electrical connection or mutual communication; it can be a direct connection or an indirect connection through an intermediate medium, and it can be the internal communication between the two elements or the interaction relationship between the two elements. For those of ordinary skill in the art, the specific meanings of the above terms in the present application can be understood according to specific situations.

In the present application, unless otherwise expressly specified and limited, a first feature "on" or "under" a second feature may include the first and second features in direct contact, or may include the first and second features not directly but through additional features between them. Also, the first feature being "above", "over" and "above" the second feature comprises the first feature being directly above and obliquely above the second feature, or simply means that the first feature is level higher than the second feature. The first feature is "under", "below" and "underneath" the second feature comprises the first feature being directly below and diagonally below the second feature, or simply means that the first feature has a lower level than the second feature.

The following disclosure provides many different embodiments or examples for implementing different structures of the present application. In order to simplify the disclosure of the present application, the components and arrangements of specific examples are described below. Of course, they are only examples and are not intended to limit the present application. Furthermore, the present application may repeat reference numerals and/or reference letters in different instances for the purpose of simplicity and clarity, and does not in itself indicate a relationship between the various embodiments and/or arrangements discussed. In addition, the present application provides examples of various specific processes and materials, but one of ordinary skill in the art will recognize the application of other processes and/or the use of other materials.

Figure 2:
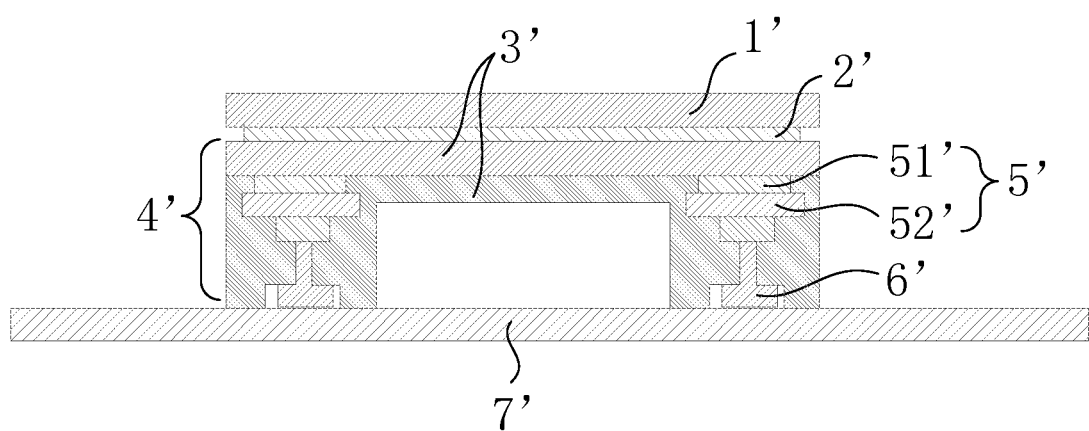
FIG. 2 is a cross-sectional schematic structural diagram of an exemplary single panel module assembled to a metal back plate.

As shown in FIG. 1 and FIG. 2, a traditional single panel splicing method is to first adhere an Open Cell (OC) display panel 1' to a metal single panel 3' through foam glue 2' to form a single panel module 4'. Wherein magnets 5' are embedded in specific positions of the metal single panel 3' (for example, first magnets 51' and second magnets 52' set in a stack) and are fixed by screws 6'. The single panel module 4' is then assembled to a large metal back plate 7' by magnetic attraction. However, the traditional single panel splicing method causes the single panel module to be heavier and thicker, and structures of the single panel module 4' is complicated and difficult to detach, the single panel module 4' is not conducive to maintenance and analysis. In addition, the display panel 1' is directly adhered to the metal single panel 3' through the foam glue 2'. Since an adhering process is a manual operation, alignment accuracy is poor, error tolerance rate is low, and an actual operation is difficult.

In order to solve the above technical problems, the present application provides a new splicing display device, for details, please refer to the description of the following embodiments.

Figure 3:
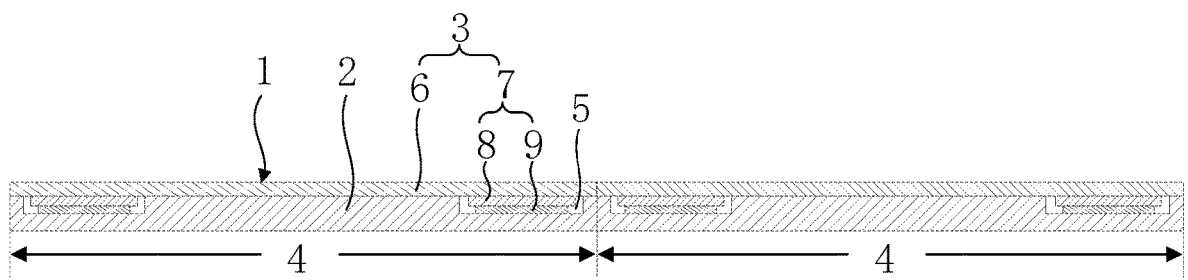
FIG. 3 is a cross-sectional schematic structural diagram of a splicing display device according to an embodiment of the present application.
Figure 4:
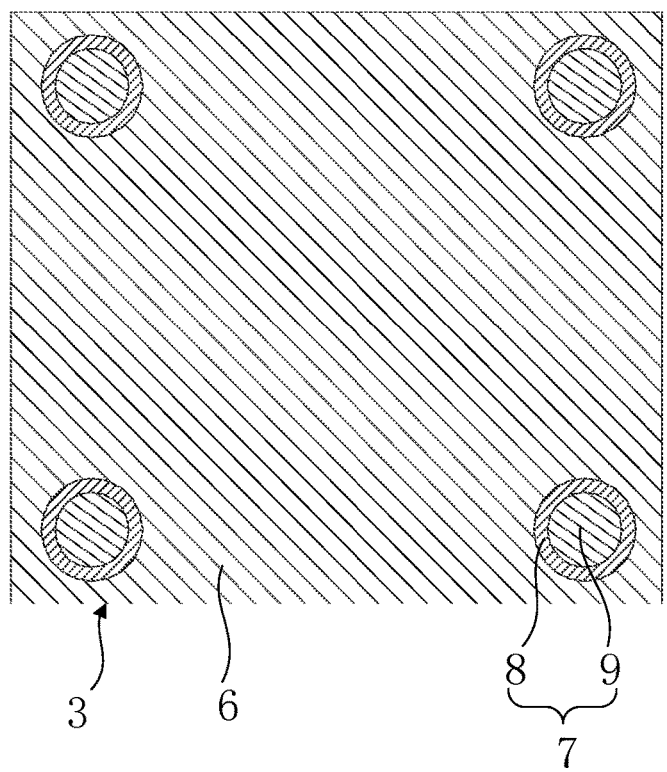
FIG. 4 is a plan view schematic structural diagram of a back of a splicing display unit according to an embodiment of the present application.

As shown in FIG. 3 and FIG. 4, an embodiment of the present application provides a splicing display device 1. The splicing display device 1 comprises a back plate 2, and a plurality of splicing display units 3 spliced and arranged on the back plate 2. The back plate 2 has a plurality of splicing areas 4 which are arranged in one-to-one correspondence with the plurality of splicing display units 3. Each of the splicing areas 4 is defined with at least one limit slot 5 opening toward the splicing display unit 3. Each splicing display unit 3 comprises a display panel 6 corresponding to the splicing area 4 and at least one connection mechanism 7 fixed to a side of the display panel 6 close to the back plate 2. The at least one limit slot 5 is arranged in one-to-one correspondence with the at least one connection mechanism 7. Each connection mechanism 7 is located in the corresponding limit slot 5 and is detachably connected to a bottom of the corresponding limit slot 5 (for example, magnetic attraction connection).

It can be understood that the connection mechanism 7 is detachably connected to the bottom of the limit slot 5, so as to realize a detachable connection between the display panel 6 and the back plate 2. In addition, a bottom of the connection mechanism 7 is laminated on the bottom of the limit slot 5, so that the connection mechanism 7 has a support effect on the display panel 6.

Specifically, the display panel 6 comprises any one of a mini-LED device and a micro-LED device, but is not limited thereto.

Specifically, as shown in FIG. 3, the side of the display panel 6 close to the back plate 2 (i.e., a back of the display panel 6) is laminated on a side of the back plate 2 close to the display panel 6, so that the back plate 2 can directly contact and support the display panel 6.

It should be noted that a side of the display panel 6 away from the back plate 2 is a light-emitting surface, and the side of the display panel 6 close to the back plate 2 is the back.

Specifically, a side of the connection mechanism 7 close to the back plate 2 is laminated on a side of the limit slot 5 close to the display panel 6, so that the back plate 2 can support the connection mechanism 7, thereby indirectly supporting the display panel 6.

Specifically, as shown in FIG. 3, a distance between at least one side surface of the connection mechanism 7 and a side wall of the corresponding limit slot 5 is greater than 0. It can be understood that a projected area of the connection mechanism 7 in a direction perpendicular to the back plate 2 is smaller than a projected area of the limit slot 5 in the direction perpendicular to the back plate 2.

In the traditional single panel splicing method, the display panel is directly adhered to the metal single panel through the foam glue. Because the adhering process is a manual operation, the alignment accuracy is poor, the error tolerance rate is low, and the actual operation is difficult. However, a design of the limit slot 5 in the embodiment of the present application enables the display panel 6 to still have a certain amount of alignment redundancy after the connection mechanism 7 is detachably and attractively connected to the back plate 2, which facilitates adjustment of a position of the splicing display unit 3, thereby ensuring the alignment accuracy of the splicing display unit 3 and the back plate 2.

Specifically, as shown in FIG. 4, the connection mechanism 7 comprises an adhesive unit 8 and an attraction unit 9; the adhesive unit 8 is located between the display panel 6 and the attraction unit 9; the attraction unit 9 is detachably and attractively connected to the bottom of the corresponding limit slot 5. It can be understood that the attraction unit 9 is fixed on the back of the display panel 6 by the adhesive unit 8.

Specifically, material of the back plate 2 comprises metal, such as iron; material of the attraction unit 9 comprises a magnet; material of the adhesive unit 8 comprises foam glue.

Specifically, an orthographic projection of the attraction unit 9 on the display panel 6 is completely located within an orthographic projection of the adhesive unit 8 on the display panel 6. It can be understood that an area of the attraction unit 9 is smaller than or equal to an area of the adhesive unit 8, so that the attraction unit 9 can be stably fixed on the back of the display panel 6.

In a specific embodiment, a shape of an orthographic projection of the connection mechanism 7 on the back plate 2 is same as a shape of an opening of the limit slot 5, for example, both are circular, but are not limited to this. The present design is more conducive to improving the alignment accuracy. Of course, in another embodiment, the shape of the orthographic projection of the connection mechanism 7 on the back plate 2 is different from the shape of the opening of the limit slot 5, as long as it is ensured that the connection mechanism 7 can be completely placed in the limit slot 5.

In a specific embodiment, a number of the connection mechanism 7 is one; in order to ensure that support force on the display panel 6 is more uniform, the connection mechanism 7 is disposed at a center of the back of the display panel 6.

In another specific embodiment, the splicing display unit 3 comprises a plurality of evenly distributed connection mechanisms 7. It can be understood that the plurality of connection mechanisms 7 are evenly distributed on the back of the display panel 6, so that the plurality of connection mechanisms 7 can evenly provide the support force to the display panel 6. For example, when a shape of the display panel 6 is rectangular, the spliced display unit 3 comprises four connection mechanisms 7 respectively disposed close to four corners of the display panel 6. Of course, a connecting mechanism 7 can also be added at a middle position of the splicing display unit 3 to further improve support stability.

In the embodiment of the present application, the connection mechanism 7 located on the back of the display panel 6 can be directly assembled into the limit slot 5 on the back plate 2, and can be detachably connected to the bottom of the limit slot 5 (for example, magnetic attraction connection), thereby realizing the detachable connection between the display panel 6 and the back plate 2. Compared with the traditional single panel splicing method, the embodiment of the present application significantly simplifies structures of the splicing display unit 3 on a basis of ensuring supportability of the display panel 6, thereby significantly reducing weight and thickness of the splicing display unit 3 and making the splicing display unit 3 thinner, lighter, and easier to detach for maintenance. Moreover, magnetic attraction force of the connection mechanism can be selected according to actual requirements. In addition, the design of the limit slot 5 makes an alignment operation of the splicing display unit 3 and the back panel 2 simple, and the position of the splicing display unit 3 can be adjusted, which is beneficial to improve the alignment accuracy.

The principles and implementations of the present disclosure are described herein using specific examples, the descriptions of the above embodiments are only used to help understand the methods and core ideas of the present disclosure. At the same time, for those skilled in the art, according to the idea of the present disclosure, there will be changes in the specific embodiments and application scope.

In summary, the content of the specification should not be construed as a limitation to the present disclosure.

What is claimed is:

1. A splicing display device, comprising:

a back plate; and a plurality of splicing display units arranged on the back plate;

wherein the back plate has a plurality of splicing areas arranged in one-to-one correspondence with the plurality of splicing display units; each of the splicing areas is defined with at least one limit slot opening toward the splicing display units; each of the splicing display units comprises a display panel corresponding to the splicing area and at least one connection mechanism fixed on a side of the display panel close to the back plate; and the at least one limit slot is arranged in one-to-one correspondence with the at least one connection mechanism; wherein each of the connection mechanisms is located in the corresponding limit slot and is detachably connected to a bottom of the corresponding limit slot, the bottom of the corresponding limit slot is one portion of the back plate;

wherein each of the splicing display unit comprises a plurality of connection mechanisms, the plurality of the connection mechanisms are evenly distributed on a back of the display panel, and a distance between two of the plurality of the connection mechanisms arranged in two adjacent splicing area and being close to a gap between two of the plurality of the splicing display units is less than a distance between two of the plurality of the connection mechanisms arranged in a same splicing area.

2. The splicing display device as claimed in claim 1, wherein the side of the display panel close to the back plate is laminated on a side of the back plate close to the display panel; a side of the connection mechanism close to the back plate is laminated on a side of the limit slot close to the display panel.

3. The splicing display device as claimed in claim 1, wherein an area of an orthographic projection of the connection mechanism on the back plate is smaller than an area of an orthographic projection of the limit slot on the back plate.

4. The splicing display device as claimed in claim 3, wherein a distance between at least one side surface of the connection mechanism and a side wall of the corresponding limit slot is greater than 0.

5. The splicing display device as claimed in claim 3, wherein a distance between any one of side surfaces of the connection mechanism and any one of side walls of the corresponding limit slot is greater than 0.

6. The splicing display device as claimed in claim 3, wherein a position of the connection mechanism in the limit slot can be adjusted so that the display panel and the back plate can be accurately aligned.

7. The splicing display device as claimed in claim 1, wherein the at least one connection mechanism comprises an adhesive unit and an attraction unit; the adhesive unit is located between the display panel and the attraction unit; and the attraction unit is detachably and attractively connected to the bottom of the corresponding limit slot.

8. The splicing display device as claimed in claim 7, wherein material of the adhesive unit comprises foam glue.

9. The splicing display device as claimed in claim 7, wherein a material of the back plate comprises metal, and a material of the attraction unit comprises a magnet.

10. The splicing display device as claimed in claim 7, wherein an orthographic projection of the attraction unit on the display panel is completely located within an orthographic projection of the adhesive unit on the display panel.

11. The splicing display device as claimed in claim 1, wherein a shape of the display panel is rectangular; the splicing display unit comprises four of the connection mechanisms respectively disposed close to four corners of the display panel.

12. The splicing display device as claimed in claim 11, wherein the splicing display unit further comprises one of the connection mechanisms located in a center of the display panel, a distance between the one of the connection mechanism in the center of the display panel to each one of the four of the connection mechanisms close to the four corners of the display panel is same.

13. The splicing display device as claimed in claim 1, wherein the connection mechanisms are two long strips distributed on both sides of the display panel and the limit slots of the back plate are also two long strips corresponding to the connection mechanisms.

14. The splicing display device as claimed in claim 1, wherein the connection mechanisms are four long strips distributed on four sides of the display panel and the limit slots of the back plate are also four long strips corresponding to the connection mechanisms.

15. The splicing display device as claimed in claim 1, when all of the plurality of the connection mechanisms are sufficient to firmly attract the display panel and the back plate together, the area of the orthographic projection of each connection mechanism on the back plate is larger, a number of the connection mechanisms is fewer, and the area of the orthographic projection of each connection mechanism on the back plate is smaller, a number of the connection mechanisms is more.

16. The splicing display device as claimed in claim 1, wherein a shape of an orthographic projection of the connection mechanism on the back plate is same as a shape of an opening of the limit slot.

17. The splicing display device as claimed in claim 16, wherein the shape of the orthographic projection of the connection mechanism on the back plate and the shape of the opening of the limit slot are both circle.

18. The splicing display device as claimed in claim 16, wherein the shape of the orthographic projection of the connection mechanism on the back plate and the shape of the opening of the limit slot are both rectangle.

19. The splicing display device as claimed in claim 1, wherein the display panel comprises any one of a mini-LED device and a micro-LED device.

* * * * *